United States Patent
Valckx et al.

(10) Patent No.: US 9,147,780 B2
(45) Date of Patent: Sep. 29, 2015

(54) SOLAR CELL, METHOD FOR MANUFACTURING SAME, AND SOLAR CELL MODULE

(71) Applicant: KANEKA CORPORATION, Osaka-shi, Osaka (JP)

(72) Inventors: Nick Valckx, Brussels (BE); Masanori Kanematsu, Settsu (JP); Jose Luis Hernandez, Brussels (BE); Daisuke Adachi, Settsu (JP); Kunta Yoshikawa, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/403,392

(22) PCT Filed: Nov. 25, 2013

(86) PCT No.: PCT/JP2013/081664
§ 371 (c)(1),
(2) Date: Nov. 24, 2014

(87) PCT Pub. No.: WO2014/097829
PCT Pub. Date: Jun. 26, 2014

(65) Prior Publication Data
US 2015/0171241 A1  Jun. 18, 2015

(30) Foreign Application Priority Data
Dec. 17, 2012 (JP) .................. 2012-274732

(51) Int. Cl.
*H01L 31/0216* (2014.01)
*H01L 31/0224* (2006.01)
*H01L 31/0392* (2006.01)

(52) U.S. Cl.
CPC .. *H01L 31/022466* (2013.01); *H01L 31/02167* (2013.01); *H01L 31/03921* (2013.01)

(58) Field of Classification Search
CPC ................... H01L 31/02167; H01L 31/02168
USPC ........................................................ 136/256
See application file for complete search history.

(56) References Cited

U.S. PATENT DOCUMENTS

| | | | |
|---|---|---|---|
| 4,586,988 | A | 5/1986 | Nath et al. |
| 2011/0294296 | A1 | 12/2011 | Aizenberg et al. |

(Continued)

FOREIGN PATENT DOCUMENTS

| | | |
|---|---|---|
| JP | 6066426 A | 4/1985 |
| JP | 2000058885 A | 2/2000 |

(Continued)

OTHER PUBLICATIONS

ISA Japanese Patent Office, International Search Report of PCT/JP2013/081664, Dec. 17, 2013, WIPO, 4 pages.

(Continued)

*Primary Examiner* — Jayne Mershon
(74) *Attorney, Agent, or Firm* — Alleman Hall McCoy Russell & Tuttle LLP

(57) ABSTRACT

In a solar cell, a collecting electrode is provided on a transparent electrode of a photoelectric conversion section having the transparent electrode on the outermost surface on one main surface side. The collecting electrode includes a first electroconductive layer and a second electroconductive layer in this order from the photoelectric conversion section side. Preferably, a self-assembled monolayer is formed on a region on the transparent electrode layer, which is not provided with the first electroconductive layer. A method for manufacturing the solar cell includes: forming a first electroconductive layer on a transparent electrode layer; forming a self-assembled monolayer on a region on the transparent electrode layer, which is not provided with the first electroconductive layer; and bringing the first electroconductive layer and a plating solution into contact with each other to form the second electroconductive layer by a plating method, in this order.

14 Claims, 5 Drawing Sheets

(56) References Cited

U.S. PATENT DOCUMENTS

| | | | |
|---|---|---|---|
| 2012/0111401 A1 | 5/2012 | Kang et al. | |
| 2013/0122645 A1 | 5/2013 | Sakamoto | |
| 2013/0312827 A1* | 11/2013 | Adachi et al. | 136/256 |

FOREIGN PATENT DOCUMENTS

| | | |
|---|---|---|
| JP | 2002256476 A | 9/2002 |
| JP | 200533184 A | 2/2005 |
| JP | 2010098232 A | 4/2010 |
| JP | 2011210972 A | 10/2011 |
| JP | 2012104802 A | 5/2012 |
| JP | WO 2013/077038 * | 5/2013 |
| WO | 2012005374 A1 | 1/2012 |

OTHER PUBLICATIONS

Xia, Younan et al., "Pattern transfer: Self-assembled monolayers as ultrathin resists", Microelectronic Engineering vol. 32, No. 1, Sep. 1996, pp. 255-268.

International Bureau of WIPO, International Preliminary Report on Patentability Issued in Application No. PCT/JP2013/081664, Jul. 2, 2015, WIPO, 6 pages.

* cited by examiner

FIG. 6 (A1)
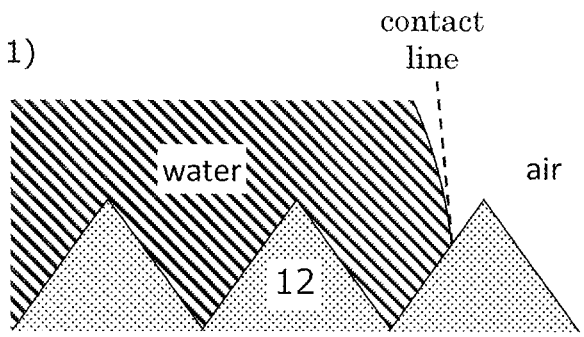
FIG. 6 (A2)
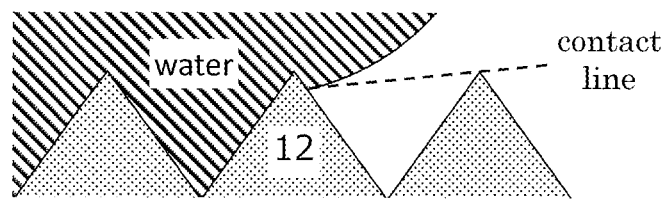
FIG. 6 (B)
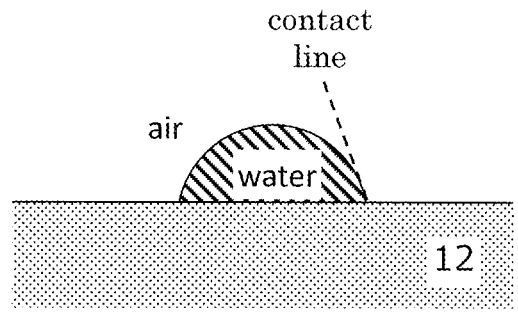

SOLAR CELL, METHOD FOR MANUFACTURING SAME, AND SOLAR CELL MODULE

TECHNICAL FIELD

The present invention relates to a solar cell and a method for manufacturing the same. Further, the present invention relates to a solar cell module.

BACKGROUND ART

Since energy issues and global environmental issues are becoming more serious, solar cells are receiving more attention as an alternative energy source for replacing fossil fuels. In the solar cell, carriers (electrons and holes) generated by light irradiation of a photoelectric conversion section composed of a semiconductor junction or the like are extracted into an external circuit to generate electricity. A collecting electrode is provided on the photoelectric conversion section of the solar cell for efficiently extracting carriers generated in the photoelectric conversion section into the external circuit.

For example, in a crystalline silicon-based solar cell using a single-crystal silicon substrate or a polycrystalline silicon substrate, a collecting electrode made of a slender metal is provided on a light receiving surface. Also, in a heterojunction solar cell having amorphous silicon layers and transparent electrode layers on a crystalline silicon substrate, collecting electrode(s) are provided on the transparent electrode layer(s).

In a silicon-based thin-film solar cell using an amorphous silicon thin-film, a crystalline silicon thin-film or the like, and a thin-film solar cell such as a compound solar cell using CIGS, CIS or the like, an organic thin-film solar cell or a dye-sensitized solar cell, a transparent electrode layer is provided on a surface of a photoelectric conversion section on the light receiving surface side in order to reduce the surface resistance of the light receiving surface. In this configuration, the transparent electrode layer can perform a function as a collecting electrode, and therefore in principle, it is not necessary to specially provide a collecting electrode. However, since conductive oxide, such as indium tin oxide (ITO) or zinc oxide, forming the transparent electrode layer has a resistivity higher than that of metal, there is a problem where the internal resistance of the solar cell increases. Thus, a collecting electrode (metal electrode as an auxiliary electrode) is provided on the surface of the transparent electrode layer to improve current extraction efficiency.

The collecting electrode of the solar cell is generally formed by pattern-printing a silver paste by a screen printing method. This method is simple in terms of the process itself, but has a problem where the material cost of silver is high, and the resistivity of the collecting electrode increases because a silver paste material containing a resin is used. For decreasing the resistivity of the collecting electrode formed of a silver paste, it is necessary to thickly print the silver paste. However, since the line width of the electrode increases with the increase of the print thickness, thinning of the electrode is difficult, and the shading loss by the collecting electrode increases.

For solving these problems, a method is known in which a collecting electrode is formed by a plating method excellent in terms of material and process costs. For example, Patent Documents 1 to 3 disclose a solar cell in which a metallic layer made of copper or the like is formed by a plating method on a transparent electrode layer that forms a photoelectric conversion section. In this method, first, a resist material layer (insulating layer) having an opening section matching the shape of a collecting electrode is formed on the transparent electrode layer of the photoelectric conversion section, and a metallic layer is formed at the resist opening section of the transparent electrode layer by electroplating. Thereafter, the resist is removed to form a collecting electrode having a predetermined shape.

Patent Document 3 discloses that the line width of a plating electrode is made equal to or less than that of an under-layer electrode by forming the plating electrode layer using a mask after a formation of the under-layer electrode. In addition, Patent Document 3 discloses that a plating solution deposited on a substrate is washed off by water after a plating, an organic solvent or the like, in view of the problem that solar cell characteristics are degraded if the solar cell, on which a plating solution remains, is exposed under a high-temperature and high-humidity environment.

A method has been also proposed in which a self-assembled monolayer is used in place of a conventional resist material when a metallic pattern is formed by a plating method. The self-assembled monolayer (abbreviated as SAM) refers to a monolayer formed such that when a so-called self-assembling compound is adsorbed (chemisorbed) on a specific base material surface, the self-assembling compound is almost regularly arranged on the base material surface due to its molecular assembling property (adsorption action by an adsorption functional group and intermolecular interaction by a group bound to the adsorption functional group).

For example, Non-Patent Document 1 discloses a method in which a self-assembled monolayer is patterned by microcontact printing, and the patterned self-assembled monolayer is used as a very thin resist to form a metallic pattern. Non-Patent Document 1 describes an electroplating method as one of the methods for forming a metallic pattern.

Patent Document 4 discloses a method in which a self-assembled monolayer is formed on a base material, the self-assembled monolayer is then partially peeled off, and an area where the self-assembled monolayer is peeled off is subjected to electroplating using the remaining self-assembled monolayer as an insulator (protective layer), so that partial plating is performed. As a method using a self-assembled monolayer for the patterning of a metal or the like for the formation of a transistor, Patent Document 5 discloses a method in which an etchant is spread over an unassembled region of a self-assembled monolayer to remove only a desired region of a base layer situated immediately below the unassembled region. In this method, a patterned layer having a property of inhibiting absorption of a self-assembled monolayer is formed on a predetermined region on a base layer, and then a self-assembled monolayer is formed on the base layer. This method takes advantage of the fact that an unassembled region of the self-assembled monolayer is obtained on the base layer in the vicinity of the patterned layer.

A technique using a self-assembled monolayer in relation to the formation of a collecting electrode of a solar cell, Patent Document 6 discloses a method in which a self-assembled monolayer is formed on a transparent electrode layer, and a collecting electrode is formed thereon to enhance the adhesion of the collecting electrode. In Patent Document 6, the collecting electrode is formed by a printing method, and the self-assembled monolayer is provided merely for enhancing adhesion with the collecting electrode. That is, Patent Document 6 does not relate to a technique for providing a collecting electrode by a plating method, and does not disclose patterning of a self-assembled monolayer, or the like.

PRIOR ART DOCUMENTS

Patent Documents

Patent Document 1: JP-60-66426
Patent Document 2: JP-A-2000-58885
Patent Document 3: JP-A-2010-98232
Patent Document 4: JP-A-2002-256476
Patent Document 5: JP-A-2005-33184
Patent Document 6: JP-A-2012-104802

Non-Patent Documents

Non-Patent Document 1: Y Xia et al., Microelectronic Engineering, vol. 32, page 255, 1996.

SUMMARY OF THE INVENTION

Problems to be Solved by the Invention

In the methods in Patent Documents 1 to 3, a resist material is required for forming a collecting electrode of a thin line pattern. The resist material is not only expensive but also has such a problem that manufacturing costs are significantly increased because the process for forming the electrodes is complicated by an underlying layer forming step, a resist removing step, and so on for performing plating. In addition, there is a problem where a transparent electrode layer has a high resistivity, and therefore when a pattern collecting electrode composed of a metal electrode layer is formed on the transparent electrode layer by electroplating without providing an under-layer electrode, the thickness of the collecting electrode (metal electrode layer) becomes non-uniform due to a voltage drop at the inner surface of the transparent electrode layer. Use of a mask matching a collecting electrode pattern as in Patent Document 3 has a problem where it is not feasible for practical use because of the expenses and man-hours that are required for preparing the mask.

A method for patterning a self-assembled monolayer by micro-contact printing as in Non-Patent Document 1 may be difficult to apply to a surface having irregularity. That is, since the thickness of the monolayer is generally about 1 nm, an area where a monolayer is not formed (printed) exists on an irregularity surface having a height of several hundreds of nm to several μm, so that a proper function as a resist may not be obtained. In general, a solar cell provided with an irregularity structure on the light incident side of a photoelectric conversion section is suitably used from the viewpoint of light confinement. Therefore, when the method in Non-Patent Document 1 is applied for forming a collecting electrode of a solar cell by a plating method, a problem may arise where a metal is deposited at an undesired location due to uneven formation of a self-assembled monolayer.

A method for partially plating a conductive base material using a self-assembled monolayer as in Patent Document 4 has a problem where, since an ultraviolet ray or laser should be applied in the form of a pattern for peeling the self-assembled monolayer, preparation of a mask corresponding to the pattern and high registering accuracy are required, leading to a significant increase in production costs. Irradiation with an ultraviolet ray or laser may cause damage to a transparent electrode layer and a semiconductor thin film that form a photoelectric conversion section, leading to deterioration of conversion characteristics and occurrence of defects such as disconnection and leakage.

The technique in Patent Document 5 is similar to that in Patent Document 4 in that a self-assembled monolayer is used in place of a resist, but it is not a technique relating to the deposition of a metal by a plating method, but is a method for selectively pattern-etching a region where a monolayer in the vicinity of a patterned layer is not assembled (unassembled region). When the method proposed in Patent Document 5 is to be applied for formation of a pattern electrode by a plating method, a plating solution infiltrates the surface of a photoelectric conversion section from an unassembled region in the vicinity of a patterned layer, so that the problem of a transparent electrode layer being damaged by the plating solution, a metal being deposited at an undesired location, or the like may occur.

An object of the present invention is reducing production man-hours and production costs of the solar cell, by solving problems of the conventional plating technique associated with the formation of a collecting electrode of the solar cell as described above.

Means for Solving the Problems

As a result of conducting vigorous studies in view of the aforementioned problems, the present inventors have found that, by subjecting the surface of a photoelectric conversion section to a predetermined treatment, a collecting electrode of a solar cell can be formed by a plating method at lower costs, leading to the present invention.

The solar cell of the present invention includes a photoelectric conversion section having a transparent electrode layer on outermost surface on one main surface side, and a collecting electrode on the transparent electrode layer. In one embodiment of the present invention, the photoelectric conversion section includes a silicon-based thin film and the transparent electrode layer in this order on a crystalline silicon substrate.

The collecting electrode includes a first electroconductive layer and a second electroconductive layer in this order from the photoelectric conversion section side. Preferably, a self-assembled monolayer is formed on a region of the surface of the transparent electrode layer, which is not provided with the first electroconductive layer.

The solar cell according to the present invention includes: a first electroconductive layer forming step of forming a first electroconductive layer on a transparent electrode layer; a monolayer forming step of forming a self-assembled monolayer on a region on the transparent electrode layer, which is not provided with the first electroconductive layer; and a second electroconductive layer forming step of forming a second electroconductive layer by a plating method, in the following order. The second electroconductive layer is formed on the first electroconductive layer by a plating method while the first electroconductive layer is in contact with a plating solution in the second electroconductive layer forming step.

Preferably, in the monolayer forming step, the self-assembled monolayer is also formed on at least a part of a region on the transparent electrode layer, which is provided with the first electroconductive layer. Preferably, the self-assembled monolayer is formed on the entire surface of the first electroconductive layer non-formed region and the first electroconductive layer-formed region on the transparent electrode layer. In one embodiment of the method for manufacturing a solar cell according to the present invention, the self-assembled monolayer on the first electroconductive layer-formed region is removed (monolayer removing step) after the monolayer forming step and before the second electroconductive layer forming step. Preferably, the self-assembled monolayer on the first electroconductive layer-formed region is removed in a plating solution.

Preferably, in the monolayer forming step, a layer made of a preparation solution for forming the self-assembled monolayer is formed on the transparent electrode layer. As the preparation solution, a solution containing a self-assembling compound is used. As the self-assembling compound of the preparation solution, an alkyl phosphonic acid compound or an alkyl silane compound is suitably used. Preferably, in the monolayer forming step, heating (annealing) is further performed after the formation of the preparation solution layer.

In one embodiment of the manufacturing method of the present invention, the contact angle $\theta_A$ of the surface of the transparent electrode layer with water in the first electroconductive layer non-formed region is 50° or more and 160° or less after the second electroconductive layer forming step. A difference between the contact angle $\theta_A'$ of the surface of the transparent electrode layer with water in the first electroconductive layer non-formed region before the second electroconductive layer forming step (before plating) and the contact angle $\theta_A$ of the surface of the transparent electrode layer with water in the first electroconductive layer non-formed region after the second electroconductive layer forming step ($\theta_A'-\theta_A$) is preferably 0° to 60°.

In a preferred embodiment of the manufacturing method of the present invention, a layer composed mainly of copper is formed as the second electroconductive layer in the second electroconductive layer forming step.

Further, the present invention relates to a solar cell module including the solar cell.

Effects of the Invention

According to the present invention, a collecting electrode can be formed by a plating method, and therefore the obtained collecting electrode has less resistance. The method for forming a collecting electrode by a plating method in the prior art requires a patterning process for an insulating layer, but according to the present invention, a pattern electrode can be easily formed by a plating method without using a mask or a resist for pattern formation. Thus, the solar cell achieves excellent productivity, and the solar cell can be provided at low costs.

BRIEF DESCRIPTION OF THE DRAWINGS

FIGS. 6(A1) to 6(B) are conceptual views for explaining a method for measuring a contact angle.

DESCRIPTION OF EMBODIMENTS

Figure 1:
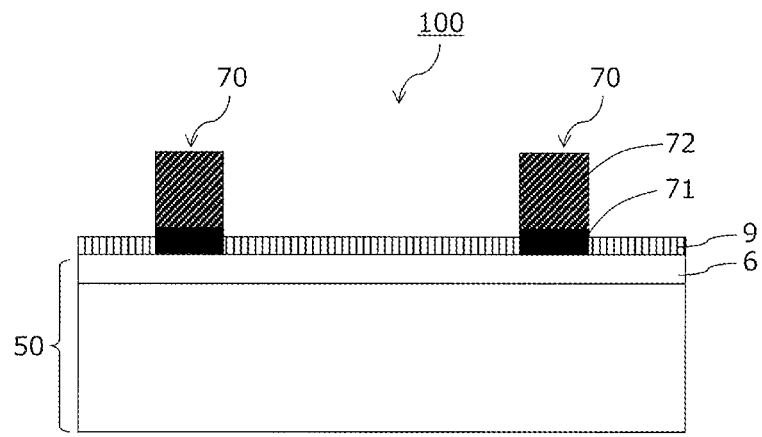
FIG. 1 is a schematic sectional view showing a solar cell of the present invention.

As schematically shown in FIG. 1, a solar cell 100 of the present invention includes a photoelectric conversion section 50 having a transparent electrode layer 6 on outermost surface on one main surface side, and a collecting electrode 70 formed on the transparent electrode 6. The collecting electrode 70 includes a first electroconductive layer 71 and a second electroconductive layer 72 in this order from the photoelectric conversion section 50 side. A self-assembled monolayer 9 is formed on a first electroconductive layer non-formed region of the transparent electrode layer 6.

The present invention will be described more in detail below, taking as an example a heterojunction crystalline silicon solar cell (hereinafter referred to as a "heterojunction solar cell" in some cases) as one embodiment of the present invention. The heterojunction solar cell is a crystalline silicon-based solar cell in which a silicon-based thin-film having a band gap different from that of a single-crystal silicon is formed on a surface of a crystalline silicon substrate of a first conductivity type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is known as one configuration of crystalline silicon solar cell with the highest conversion-efficiency.

Figure 2:
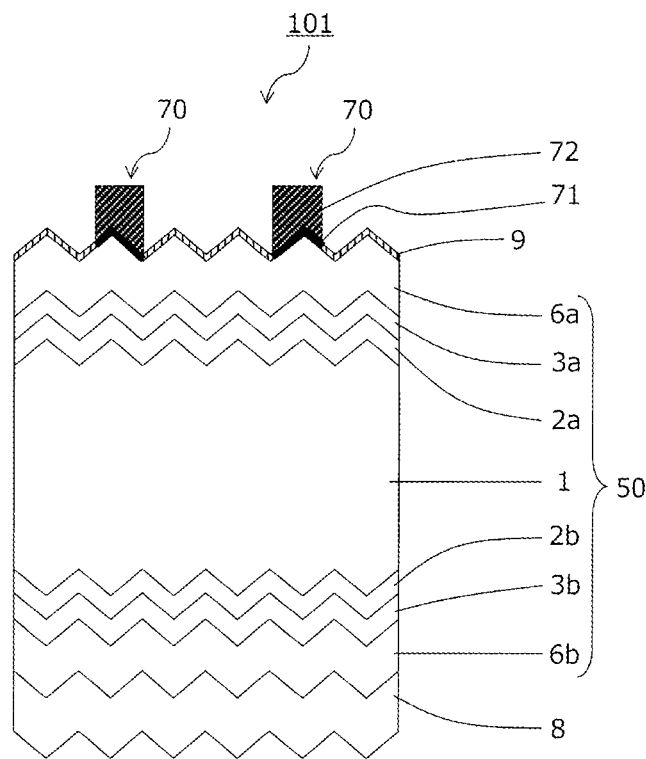
FIG. 2 is a schematic sectional view showing an embodiment of a heterojunction solar cell.

FIG. 2 is a schematic sectional view of a crystalline silicon-based solar cell according to one embodiment of the present invention. A crystalline silicon-based solar cell 101 includes, as a photoelectric conversion section 50, a conductive silicon-based thin-film 3a and a light incident side transparent electrode layer 6a, arranged in this order, on one surface (surface on the light incident side) of a single-crystal silicon substrate 1 of a first conductivity type. A conductive silicon-based thin-film 3b and a back side transparent electrode layer 6b are preferably provided in this order on the other surface of the single-crystal silicon substrate 1 of the first conductivity type. A collecting electrode 70 including a first electroconductive layer 71 and a second electroconductive layer 72 is formed on the light incident side transparent electrode layer 6a of the surface of the photoelectric conversion section 50. A self-assembled monolayer 9 is formed on a first electroconductive layer non-formed region of the transparent electrode layer 6a.

Intrinsic silicon-based thin-films 2a and 2b are preferably provided between the single-crystal silicon substrate 1 of the first conductivity type and the conductive silicon-based thin-films 3a and 3b. A back side metal electrode 8 is preferably provided on the back side transparent electrode layer 6b.

First, the single-crystal silicon substrate 1 of the first conductivity type used in the crystalline silicon-based solar cell will be described. Generally, the single-crystal silicon substrate contains impurities that supply charges to silicon for imparting conductivity. The single-crystal silicon substrate is classified into an n-type which contains atoms for introducing electrons into silicon atoms (e.g. phosphorus) and a p-type which contains atoms for introducing holes into silicon atoms (e.g. boron). That is, the "first conductivity type" in the present invention means one of an n-type and a p-type.

In a heterojunction solar cell, electron/hole pairs can be efficiently separated and collected by setting a reverse junction as a heterojunction on the incident side at which light incident to the single-crystal silicon substrate is absorbed most, thereby providing a strong electric field. Therefore, the heterojunction on the light incident side is preferably a reverse junction. When holes and electrons are compared, electrons, which are smaller in effective mass and scattering cross section, are generally larger in mobility. Accordingly, it is preferred that the crystalline silicon substrate 1 is an n-type single-crystal silicon substrate. In order to enhance a light confinement, the single-crystal silicon substrate preferably has a textured structure on its surface.

A silicon-based thin-film is formed on the surface of the single-crystal silicon substrate 1 of the first conductivity type on which a texture is formed. The method for forming these silicon-based thin-film layers is preferably plasma enhanced CVD. Conditions used for forming the silicon-based thin-film layers are preferably as follows: a substrate temperature of 100 to 300° C., a pressure of 20 to 2600 Pa, and a high-frequency power density of 0.004 to 0.8 W/cm². A source gas used to form the silicon-based thin-film layers may be a silicon-containing gas such as $SiH_4$ or $Si_2H_6$, or a mixed gas of silicon-based gas and $H_2$.

The conductive silicon-based thin-film 3 is a silicon-based thin-film of the first conductivity type or an opposite conductivity type. For example, when an n-type single-crystal silicon substrate is used as the single-crystal silicon substrate 1 of the first conductivity type, the silicon-based thin-film of the first conductivity type and the silicon-based thin-film of the opposite conductivity type are n- and p-types, respectively. A dopant gas for forming the p-type layer or the n-type layer is preferably, for example, $B_2H_6$ or $PH_3$. The amount of impurity such as P or B added is sufficient to be a trace amount; thus, it is preferred to use a mixed gas wherein $B_2H_6$ or $PH_3$ is diluted beforehand with $SiH_4$ or $H_2$. When a gas containing a different element, such as $CH_4$, $CO_2$, $NH_3$ or $GeH_4$, is added thereto, silicon is alloyed so that the energy gaps of the conductive silicon-based thin-film layers can be changed.

Examples of the silicon-based thin-film include an amorphous silicon thin-film and microcrystalline silicon (a thin-film including amorphous silicon and crystalline silicon). Among them, an amorphous silicon-based thin-film is preferably used. When an n-type single-crystal silicon substrate is used as the single-crystal silicon substrate 1 of the first conductivity type, examples of the preferred structure of the photoelectric conversion section 50 include a stacked structure in the order of transparent electrode layer 6a/p-type amorphous silicon-based thin-film 3a/i-type amorphous silicon-based thin-film 2a/n-type single-crystal silicon substrate 1/i-type amorphous silicon-based thin-film 2b/n-type amorphous silicon-based thin-film 3b/transparent electrode layer 6b. In this case, for the aforementioned reason, the light incident surface is preferably on the p layer side.

The intrinsic silicon-based thin-films 2a and 2b are preferably i-type hydrogenated amorphous silicon composed of silicon and hydrogen. When i-type hydrogenated amorphous silicon is formed on a single-crystal silicon substrate by a CVD method, surface passivation can be effectively performed while suppressing diffusion of impurities to the single-crystal silicon substrate. When the amount of hydrogen in the film is changed along the thickness direction, the layer may have an energy gap profile that is effective for collecting carriers.

The p-type silicon-based thin-film is preferably a p-type hydrogenated amorphous silicon layer, a p-type amorphous silicon carbide layer or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable in the sense that optical losses can be reduced.

In the present invention, the photoelectric conversion section 50 of the heterojunction solar cell 101 preferably includes a transparent electrode layer 6a on the conductive silicon-based thin-film 3a. In addition, the solar cell preferably includes another transparent electrode layer 6b on the conductive silicon-based thin-film 3b. The transparent electrode layers 6a and 6b are composed mainly of a conductive oxide. As the conductive oxide, for example, zinc oxide, indium oxide and tin oxide may be used alone or in mixtures thereof. From the viewpoints of electroconductivity, optical characteristics and long-term reliability, indium-based oxides are preferable. Among them, those composed mainly of indium tin oxide (ITO) are more suitably used. Here, the wording "composed mainly of" means that the content is more than 50% by weight, preferably 70% by weight or more, and more preferably 90% by weight or more. The transparent electrode layer may be a single layer or a layered structure composed of multiple layers.

A dopant can be added to the transparent electrode layer. For example, when zinc oxide is used for the transparent electrode layer, examples of the dopant include aluminum, gallium, boron, silicon, and carbon. When indium oxide is used for the transparent electrode layer, examples of the dopant include zinc, tin, titanium, tungsten, molybdenum, and silicon. When tin oxide is used for the transparent electrode layer, examples of the dopant include fluorine.

The dopant can be added to one or both of the light incident side transparent electrode layer 6a and the back side transparent electrode layer 6b. In particular, the dopant is preferably added to the light incident side transparent electrode layer 6a. By adding the dopant to the light incident side transparent electrode layer 6a, the transparent electrode layer itself is made less resistive, and the resistance loss between the transparent electrode layer 6a and the collecting electrode 70 can be suppressed.

The thickness of the light incident side transparent electrode layer 6a is preferably set to 10 nm or more and 140 nm or less, from the viewpoints of transparency, electroconductivity and reduction of light reflection. The role of the transparent electrode layer 6a is to transport carriers to the collecting electrode 70, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited, but a physical vapor deposition method such as a sputtering method, a chemical vapor deposition (MOCVD) method utilizing a reaction of an organic metal compound with oxygen or water, or the like is preferable. In any formation methods, energy from heat or plasma discharge may be utilized.

The substrate temperature during the formation of the transparent electrode layer may appropriately set. For example, when an amorphous silicon-based thin-film is used as a silicon-based thin-film, the substrate temperature is preferably 200° C. or lower. By ensuring that the substrate temperature is 200° C. or lower, desorption of hydrogen from the amorphous silicon layer and associated generation of a dangling bond to a silicon atom can be suppressed, and as a result, conversion efficiency can be improved.

A back side metal electrode 8 is preferably formed on the back side transparent electrode layer 6*b*. For the back side metal electrode 8, it is desirable to use a material having a high reflectivity in a near-infrared to infrared range, and having high electroconductivity and chemical stability. Examples of the material satisfying these characteristics include silver and aluminum. The method for forming a back side metal electrode layer is not particularly limited, and a physical vapor deposition method such as a sputtering method or a vacuum vapor deposition method, a printing method such as screen printing, or the like is applicable.

On the transparent electrode layer 6*a*, a collecting electrode 70, including a first electroconductive layer 71 and a second electroconductive layer 72, in this order, is formed. A preferred aspect of a method for manufacturing a collecting electrode in the present invention will be described below based on the drawings.

Figure 3:
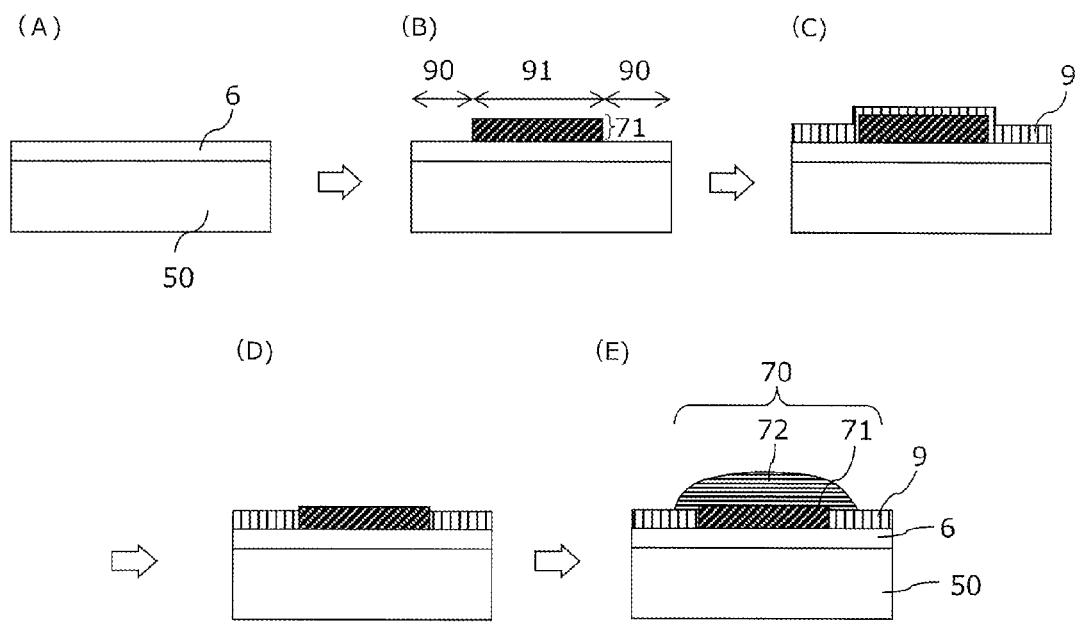
FIG. 3 is a conceptual view of a process of manufacturing a solar cell according to one embodiment of the present invention.

FIG. 3 is a schematic procedural view showing one embodiment of a method for forming a collecting electrode 70 on a photoelectric conversion section 50 of a solar cell. In this embodiment, first, the photoelectric conversion section 50 having a transparent electrode layer 6 on the outermost surface is provided (a photoelectric conversion section providing step; FIG. 3 at (A)). For example, in the case of a heterojunction solar cell, a photoelectric conversion section including a silicon-based thin-film and a transparent electrode layer is provided on a silicon substrate of a first conductivity type, as described above.

The first electroconductive layer 71 is formed on the transparent electrode layer 6 of the photoelectric conversion section (first electroconductive layer forming step; FIG. 3 at (B)). Here, in this specification, the region 90, which is not provided with the first electroconductive layer, on the surface of the transparent electrode layer 6 of the photoelectric conversion section is referred to as a first electroconductive layer non-formed region (region A), and the region, which is provided with the first electroconductive layer, on the surface of the transparent electrode layer 6 of the photoelectric conversion section is referred to as a first electroconductive layer-formed region 91 (region B) as shown in FIG. 3 at (B).

After the first electroconductive layer 71 is formed, the self-assembled monolayer 9 is formed on the transparent electrode layer in the region A (i.e., the region of the transparent electrode layer 6, which is not provided with the first electroconductive layer 71) and on the first electroconductive layer 71 in the region B (monolayer forming step, FIG. 3 at (C)). In this step, the self-assembled monolayer 9 may be formed only on the transparent electrode layer 6 in the region A, or may also be formed on the first electroconductive layer 71 in the region B.

After the monolayer forming step, the second electroconductive layer 72 is formed on the surface of the first electroconductive layer 71 in the second electroconductive layer forming step (FIG. 3 at (E)). In the present invention, the transparent electrode layer 6 can be protected from a plating solution during the formation of the second electroconductive layer because the self-assembled monolayer 9 is formed on the transparent electrode layer 6 in the region A. When the self-assembled monolayer 9 is also formed on the first electroconductive layer 71 in the region B in the monolayer forming step, it is preferred that the second electroconductive layer is formed after the self-assembled monolayer on the first electroconductive layer 71 is selectively removed as shown in FIG. 3 at (D).

When a self-assembled monolayer having a high adhesion strength with the transparent electrode layer and a low adhesion strength with the first electroconductive layer is used, the self-assembled monolayer formed on the first electroconductive layer can be selectively removed without patterning using a mask, or the like. Examples of the method for selectively removing the self-assembled monolayer on the first electroconductive layer include a method in which, by bringing the self-assembled monolayer into contact with a liquid, the adhesive strength between the first electroconductive layer and the self-assembled monolayer is reduced to peel and remove the self-assembled monolayer. For example, by immersing the substrate in a plating solution after the formation of the self-assembled monolayer to bring the self-assembled monolayer and the plating solution into contact with each other, the self-assembled monolayer on the first electroconductive layer can be selectively peeled and removed. Before the self-assembled monolayer and the plating solution are brought into contact with each other, the self-assembled monolayer may be brought into contact with another liquid to reduce the adhesive strength between the first electroconductive layer and the self-assembled monolayer.

Preferably, the self-assembled monolayer on the first electroconductive layer is peeled and removed in the plating solution. Before the self-assembled monolayer is peeled and removed in the plating solution, the self-assembled monolayer may be brought into contact with a liquid to reduce the adhesive strength between the first electroconductive layer and the self-assembled monolayer. For simplifying the process, it is preferred that the adhesive strength between the first electroconductive layer and the self-assembled monolayer is reduced to peel and remove the self-assembled monolayer.

When plating is performed with the first electroconductive layer 71 exposed by selectively removing the self-assembled monolayer on the first electroconductive layer (region B), the second electroconductive layer 72 is selectively formed on the surface of the first electroconductive layer 71 by a plating method. According to this method, a second electroconductive layer corresponding to the shape of the collecting electrode can be formed by a plating method, by immersing the substrate in a plating solution after the formation of the self-assembled monolayer to selectively remove the self-assembled monolayer on the first electroconductive layer without providing an insulating layer or the like having an opening section corresponding to the shape of the collecting electrode. In other words, in a preferred embodiment of the present invention, a monolayer removing step of removing a self-assembled monolayer on a first electroconductive layer by immersing a substrate in a plating solution and a subsequent second electroconductive layer forming step of forming a second electroconductive layer by a plating method are carried out in the "plating step".

The first electroconductive layer 71 is a layer that functions as an electroconductive underlying layer when the second electroconductive layer is formed by a plating method. Therefore, it suffices that the first electroconductive layer has such a level of electroconductivity that it can function as an underlying layer for electrolytic plating. In this specification, those having a volume resistivity of $10^{-2}$ Ω·cm or less are defined as being electroconductive. Those having a volume resistivity of $10^2$ Ω·cm or more are defined as insulating.

The thickness of the first electroconductive layer 71 is preferably 20 μm or less, and more preferably 10 μm or less, in terms of costs. On the other hand, the thickness is preferably 0.5 µm or more, and more preferably 1 µm or more, so that the line resistance of the first electroconductive layer 71 falls within a desired range.

The first electroconductive layer 71 can be prepared by a known technique such as an inkjet method, a screen printing method, a conductor wire bonding method, a spray method, a vacuum deposition method, a sputtering method, or the like. In this case, the first electroconductive layer may be formed using a mask corresponding to the pattern shape as necessary. Preferably, the first electroconductive layer 71 is patterned in a predetermined shape such as a comb-shape. For formation of the patterned first electroconductive layer, the screen printing method is suitable from the viewpoint of productivity.

On the other hand, when a material including a solvent is used as a printing paste, a drying step for removing the solvent is required. The drying time can be appropriately set to, for example, about 5 minutes to 1 hour.

The method for forming the self-assembled monolayer 9 is not particularly limited, and a known method may be used. For example, when a self-assembling compound is supplied onto the surface of the region A or the region B, a monolayer is formed by the assembling action (self-assembling action) of molecules. Examples of the method for supplying a self-assembling compound include a method in which a layer made of a preparation solution for forming a self-assembled monolayer is formed on the surface of the region A or the region B. The preparation solution is a solution containing a self-assembling compound and a solvent. As a method for forming a preparation solution layer, a method in which the whole substrate after the formation of the first electroconductive layer is immersed in the preparation solution, or a method in which the preparation solution is applied to the surface on the region A or on the region B can be suitably used.

The preparation solution layer may be formed only on the first electroconductive layer non-formed region (region A), or may be formed on the entire surface without differentiating the first electroconductive layer non-formed region (region A) and the first electroconductive layer-formed region (region B). Preferably, the preparation solution layer containing a self-assembling compound is formed on the whole of the region A and the region B for enhancing productivity by easily forming the self-assembled monolayer 9 without depending on pattern printing.

The concentration of the preparation solution can be appropriately selected according to the types of the self-assembling compound and the solvent. For example, when an alkyl phosphonic acid compound or an alkyl silane compound is used as the self-assembling compound, the concentration of the preparation solution is preferably 0.5 to 20 mM, and more preferably 3 to 10 mM.

The solvent of the preparation solution may be one in which the self-assembling compound can be dissolved, a polar solvent is preferably used, and for example an alcohol that is a protic solvent can be preferably used. Particularly, when an alkyl phosphonic acid compound or an alkyl silane compound is used as the self-assembling compound, isopropyl alcohol or ethanol is more preferably used. For the preparation solution, a solvent other than those described above or a mixed solvent may be used as long as the feature of the present invention is not impaired. The preparation solution may contain additives such as a surfactant and a defoaming agent.

When the preparation solution layer is formed by immersion in the preparation solution, the immersion time may be appropriately adjusted according to the type of the self-assembling compound, the solvent, and the like. For enhancing productivity, the immersion time is preferably 30 seconds to 120 minutes, further preferably 50 seconds to 70 minutes.

In the monolayer forming step, it is preferred to dry the solvent contained in the preparation solution after the formation of the preparation solution layer. The solvent can be dried by, for example, air-drying or heating (annealing). Particularly, it is preferred to dry the solvent by heating. By heat annealing the preparation solution layer, not only is the solvent dried, but the self-assembling compound supplied to the first electroconductive layer non-formed region (region A) can also be more strongly adhered to the transparent electrode layer. It is considered that, particularly when the self-assembling compound forms a hydrogen bond with the transparent electrode layer, a dehydration condensation reaction or the like is caused by heating, so that a chemical bond more stable than the hydrogen bond is formed to enhance adhesion.

In the monolayer forming step, the number of times of forming the preparation solution layer may be only one time, or two or more times. When heat annealing is performed after the formation of the preparation solution layer, a cycle including formation of the preparation solution layer and annealing may be performed two or more times. There is a tendency that when formation of the preparation solution layer and heat annealing are repeatedly performed two or more times, the transparent electrode layer can be covered with a self-assembled monolayer having no defect. The number of times described above may be appropriately selected according to the material and the concentration of the self-assembling compound, the type of the solvent of the preparation solution, and the like, and is preferably 1 to 3, and more preferably 1 or 2.

The heating temperature during heat annealing is preferably lower than the heat-resistant temperature of the photoelectric conversion section 50. The heat resistant temperature of the photoelectric conversion section is a temperature at which characteristics of a solar cell, including the photoelectric conversion section (also referred to as "cell") or a solar cell module prepared using the cell, are irreversibly reduced. When the preparation solution layer is dried by air-drying, the preparation solution layer can be dried at about room temperature by, for example, air blowing.

In the present invention, the annealing temperature is preferably set at 250° C. or lower because the photoelectric conversion section has the transparent electrode layer. Particularly, in the heterojunction solar cell, the photoelectric conversion section includes an amorphous silicon-based thin film, and therefore the annealing temperature is preferably set at a temperature in the above-mentioned range from the viewpoint of suppression of thermal damage at the amorphous silicon-based thin film and the interface thereof. For achieving a solar cell having higher performance, the annealing temperature is more preferably 200° C. or lower, further preferably 180° C. or lower. The annealing time may be appropriately adjusted according to the annealing temperature, the preparation solution to be used, and the like. For example, when heating is performed at about 100° C. to 180° C., the annealing time is preferably 5 to 120 minutes, and more preferably 5 to 30 minutes from the viewpoint of productivity.

Heat annealing of the preparation solution layer may also include the drying and solidification of the first electroconductive layer. For example, an electroconductive paste is printed as a first electroconductive layer, and then temporarily dried to such an extent that form stability can be maintained, and a preparation solution layer is formed on the electroconductive paste, so that the paste of the first electroconductive layer can be dried and solidified during heat annealing of the preparation solution layer.

In the monolayer forming step, the self-assembled monolayer 9 is formed on the entire surface of the first electroconductive layer non-formed region (region A) of the transparent electrode layer. Here, the "entire surface" means that, in addition to just 100%, the self-assembled monolayer is formed on 90% or more of the region A in terms of an area, allowing for very small pinholes and the like to locally exist within the bounds of being able to protect the transparent electrode layer 6 from a plating solution. For more reliably protecting the transparent electrode layer from a plating solution, the self-assembled monolayer is formed on preferably 95% or more, and more preferably 98% or more of the region A. Ideally, the self-assembled monolayer is formed on 100% of the region A. As described above, the self-assembled monolayer 9 may also be formed on the first electroconductive layer (region B).

When the self-assembled monolayer 9 is formed on the entire surface of the region A, the photoelectric conversion section can be chemically and electrically protected from a plating solution when the second electroconductive layer is formed by a plating method. That is, when the self-assembled monolayer 9 is formed on the transparent electrode layer 6, which is the outermost surface layer of the photoelectric conversion section, contact of the transparent electrode layer with a plating solution is suppressed, so that deposition of a metal layer (second electroconductive layer) on the transparent electrode layer can be prevented.

Preferably, the self-assembled monolayer 9 is electrically insulating. It is desirable that the self-assembled monolayer 9 has chemical stability to a plating solution. In this case, the self-assembled monolayer is hardly dissolved in the plating solution in the plating step, so that the transparent electrode layer 6 on the surface of the photoelectric conversion layer is hardly damaged. It is preferred that the self-assembled monolayer 9 has a high adhesion strength with the transparent electrode layer 6, and retains the adhesion strength with the transparent electrode layer even when exposed to the plating solution. In this case, the self-assembled monolayer 9 is hardly peeled from the transparent electrode layer 6, so that deposition of a metal on the transparent electrode layer can be prevented.

On the other hand, it is preferred that when the self-assembled monolayer 9 is exposed to the plating solution, its adhesion strength with the first electroconductive layer 71 decreases. Consequently, even when the self-assembled monolayer 9 is formed on the first electroconductive layer (region B) in the monolayer forming step, the second electroconductive layer can be formed on the first electroconductive layer because in the plating step, the monolayer on the first electroconductive layer is selectively peeled and removed, so that the first electroconductive layer 71 comes into contact with the plating solution. It is particularly preferred that the self-assembled monolayer 9 has a high adhesion strength with the transparent electrode layer and a low adhesion strength with the first electroconductive layer. In this case, the second electroconductive layer can be selectively formed on the first electroconductive layer while the transparent electrode layer is protected from the plating solution.

Preferably, the self-assembled monolayer 9 has low light absorption. The self-assembled monolayer 9 is formed on the light incident surface side of the photoelectric conversion section 50, and therefore if optical absorption by the self-assembled monolayer is low, a larger amount of light can be introduced to the photoelectric conversion section. For example, when the self-assembled monolayer 9 has sufficient transparency with a transmittance of 90% or more, the optical loss at the self-assembled monolayer by optical absorption is low, and direct use as a solar cell can be made without removing the self-assembled monolayer after forming the second electroconductive layer. Consequently, the process for manufacturing the solar cell can be simplified, so that productivity can be further improved.

The transparent electrode layer often has low resistance to a strongly acidic or strongly basic liquid. Therefore, when the transparent electrode layer constitutes a surface of the substrate which is to be plated, the transparent electrode layer on the surface of the substrate is easily etched when the substrate is exposed to a plating solution. Since a transparent electrode layer of ITO or the like is generally hydrophilic, the contact angle of the substrate surface with water is often about 10° or less when the transparent electrode layer constitutes the substrate surface. Therefore, when the transparent electrode layer constitutes the substrate surface, not only the transparent electrode layer is easily etched because resistance to a plating solution is low, but also a metal layer tends to be easily deposited by plating because the substrate surface is hydrophilic and electroconductive. In the present invention, the self-assembled monolayer formed on the region A of the transparent electrode layer functions as an insulating water-repellent layer, and therefore the transparent electrode layer can be protected from a plating solution.

The "substrate surface" means a surface on one main surface side of the photoelectric conversion section, and refers to a surface that may come into contact with a plating solution in the plating step. That is, the "substrate surface" means at least one of the surface of the transparent electrode layer, the surface of the first electroconductive layer, the surface of the self-assembled monolayer, and the surface of the second electroconductive layer.

When the self-assembled monolayer 9 is formed on the entire surfaces of both the first electroconductive layer-formed region (region A) and first electroconductive layer non-formed region (region B), the surface of the self-assembled monolayer constitutes the substrate surface. When the region B partially includes a region having no self-assembled monolayer, the surface of the first electroconductive layer and the surface of the self-assembled monolayer constitute the substrate surface. After the second electroconductive layer is formed on the first electroconductive layer, the surface of the second electroconductive layer constitutes the substrate surface.

The contact angle is determined by measuring an angle formed by the substrate and a contact line of air and water using a contact angle meter. When a surface texture structure (irregularity structure) in an order of several μm to several tens of μm is provided on the substrate surface as in the crystalline silicon-based solar cell shown in FIG. 2, the angle of the substrate with the contact line varies from one location to another in a microscopic region in a scale of the surface structure as shown in FIGS. 6(A1) and 6(A2). Therefore, when a texture structure is provided on the substrate surface, the contact angle is defined by an angle of the substrate with the contact line, which is obtained when observed in such a visual field that the surface can be considered even (i.e., about 10 times as large as the size of the surface structure) (see FIG. 6(B)).

Figure 4:
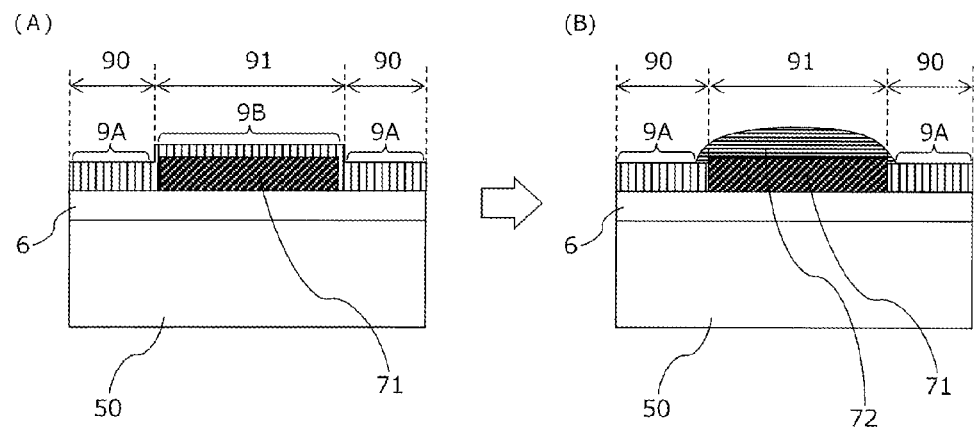
FIG. 4 is a conceptual view of a solar cell according to one embodiment of the present invention before and after the plating step, respectively.

In the present invention, as shown in FIG. 4 at (A), the self-assembled monolayer 9 is formed on the entire surface of the transparent electrode layer in the region A in the monolayer forming step. Further, the self-assembled monolayer 9 may also be formed on at least a part of the first electro conductive layer in the region B.

The contact angle $\theta_A{}'$ of the substrate surface with water in the region A after the formation of the self-assembled monolayer 9 and before formation of the second electroconductive layer, i.e., just before the immersion of the substrate in the plating solution, is preferably 60° or more, more preferably 90° or more, and especially preferably 110° or more. When $\theta_A{}'$ is in the above-mentioned range, the transparent electrode layer can be protected from the plating solution.

The optimum value of the contact angle of the substrate surface with water also varies depending on a surface shape of the substrate 12. For example, when a surface texture structure in an order of several μm to several tens of μm, which originates in the surface shape of the crystalline silicon substrate 1, is provided as in the heterojunction solar cell shown in FIG. 2, $\theta_A{}'$ is preferably 70° or more, more preferably 100° or more, and especially preferably 120° or more. On the other hand, when the substrate 12 has no surface texture, $\theta_A{}'$ is preferably 60° or more, more preferably 90° or more, and especially preferably 110° or more.

The contact angle $\theta_A$ of the substrate surface with water in the region A after the formation of the second electroconductive layer is preferably 50° or more, more preferably 80° or more, and especially preferably 100° or more. $\theta_A$ is preferably 160° or less, more preferably 150° or less, and further preferably 140° or less. When a surface texture structure in an order of several μm to several tens of μm, which originates in the surface shape of the crystalline silicon substrate 1, or the like, is provided as in the above mentioned example of the heterojunction solar cell, $\theta_A$ is preferably 60° or more, more preferably 90° or more, and especially preferably 110° or more. On the other hand, when the substrate 12 has no surface texture, $\theta_A$ is preferably 50° or more, more preferably 80° or more, and especially preferably 100° or more.

A difference in contact angle of the substrate surface with water ($\theta_A{}' - \theta_A$) before and after the formation of the second electroconductive layer is preferably small, and preferably 0° to 60°. Particularly, the difference is preferably 40° or less, and more preferably 30° or less. In this case, it is considered that even when the substrate is exposed to a plating solution, the self-assembled monolayer is hardly peeled from the transparent electrode layer, so that the transparent electrode layer can be protected from the plating solution.

The contact angle $\theta_B{}'$ of the substrate surface with water in the region B before the second electroconductive layer forming step is not particularly limited, and may be comparable to $\theta_A{}'$. Preferably, the first electroconductive layer is exposed during the formation of the second electroconductive layer, i.e., after the substrate is immersed in the plating solution and before plating is performed. Therefore, when the self-assembled monolayer is also formed in the region B in the monolayer forming step, it is preferred that, at a time when the substrate is immersed in the plating solution, wettability of the region B to the plating solution is high, so that the self-assembled monolayer on the region B is easily removed by coming into contact with the plating solution. From such a viewpoint, it is preferred that the surface of the region B has a low contact angle with water, but does not excessively repel the plating solution, $\theta_B{}'$ is preferably 160° or less, and more preferably 150° or less. Since a self-assembled monolayer that is similar to that in the region B is also formed in the region A when the self-assembled monolayer is formed on the entire surface without differentiating region A and region B as described above, $\theta_A{}'$ is preferably 160° or less, and more preferably 150° or less.

It is preferred that the self-assembled monolayer formed in the region B is removed as much as possible at a time when the second electroconductive layer is formed as described above. In this case, the contact angle of the substrate surface with water in the region B, i.e., the contact angle of the surface of the first electroconductive layer is about 1° to 40°, for example, when a metallic paste is used as the first electroconductive layer. The contact angle $\theta_B$ of the substrate surface with water in the region B after the second electroconductive layer forming step is closer to the contact angle of the second electroconductive layer with water as plating proceeds. Depending on a material to be used as the second electroconductive layer, $\theta_B$ is about 1° to 40°.

As described above, in the present invention, a water-repellent treatment is performed due to the formation of the self-assembled monolayer on the substrate surface, and therefore the surface of the transparent electrode layer can be easily protected from the plating solution without forming an insulating layer such as a pattern resist layer.

As a self-assembling compound that forms the self-assembled monolayer 9, one that enables the self-assembled monolayer to satisfy the above-described insulating property, chemical stability, adhesion strength and light permeability can be suitably used. As the self-assembling compound, for example, a material described in JP-A-2011-210972 can be used, and an appropriate one may be selected according to an adhesion strength with a transparent electrode layer to be used, and the like. For example, when ITO is used for the transparent electrode layer 6, an alkyl phosphonic acid compound or an alkyl silane compound is preferably used as the self-assembling compound for further improving the adhesive strength.

Particularly, when the transparent electrode layer 6 has irregularity on the surface as in the heterojunction solar cell shown in FIG. 2, a self-assembling compound capable of easily forming a monolayer, which causes little damage to the irregularity surface and has high uniformity, is preferably used. Particularly, a compound having a phosphonic acid group or a silyl group as an adsorptive functional group which adsorbs on the surface of the substrate (transparent electrode layer) is preferably used because of its high adhesive strength with a metal oxide that forms the transparent electrode layer. The self-assembling compound is preferably a compound having an alkyl chain as a hydrophobic group because of the strong effect of protecting the transparent electrode layer against a plating solution when the substrate is immersed in the plating solution, and particularly a compound having an alkyl chain having 10 to 20 carbon atoms is preferably used from the viewpoints of solubility in a solvent and stability of a monolayer formed. When the number of carbon atoms in the alkyl chain is 10 or more, cohesive force by the Van der Waals force (hydrophobic interaction) between molecules is increased, so that a monolayer excellent in strength and adhesiveness is obtained. When the number of carbon atoms in the alkyl chain is 20 or less, solubility in a solvent is improved, so that the preparation of a preparation solution and formation of a preparation solution layer are facilitated.

The alkyl chain in the self-assembling compound may have another functional group such as an unsaturated bond or a benzene ring as long as the feature of the present invention is not impaired. The alkyl chain may be linear or branched. For improving the self-assembling property of a hydrophobic group to form a dense film, so that the effect of protecting the transparent electrode layer is enhanced, a compound having a linear alkyl group having 10 to 20 carbon atoms is especially preferably used as the hydrophobic group.

Considering the above-described points together, an alkyl phosphonic acid compound or an alkyl silane compound is preferably used as the self-assembling compound because of its high adhesive strength with the transparent electrode layer and its strong effect of protecting the transparent electrode layer against a plating solution. Particularly, an alkyl phosphonic acid compound having 10 to 20 carbon atoms is preferred, and particularly a linear alkyl phosphonic acid compound having 10 to 20 carbon atoms is especially preferred because, at the time of immersion in a plating solution, adhesion of the monolayer on the first electroconductive layer non-formed region (region A) is kept strong, and the monolayer on the first electroconductive layer-formed region (region B) can be easily peeled. Specific examples of the alkyl phosphonic acid compound include octadecyl phosphonic acid (ODPA, number of carbon atoms in alkyl group: 18) and tetradecyl phosphonic acid (TDPA, number of carbon atoms in alkyl group: 14).

A plating step is carried out after the monolayer forming step. In the plating step, the substrate in which a self-assembled monolayer is formed on the surface is immersed in a plating solution, so that a second electroconductive layer is formed on the first electroconductive layer by a plating method. Preferably, the self-assembled monolayer 9 formed on the first electroconductive layer 71 in the region B is selectively removed by contact between the substrate and the plating solution when immersing the substrate in the plating solution or during the formation of the second electroconductive layer as described above.

That is, even when the self-assembled monolayer 9 is formed on both the region A and the region B as shown in FIG. 4 at (A), the self-assembled monolayer 9B on the region B can be selectively removed while the self-assembled monolayer 9A formed on the region A is retained on the transparent electrode layer in the plating step, so that a part or the whole of the surface of the first electroconductive layer 71 is exposed, followed by forming the second electroconductive layer 72 thereon (see FIG. 4 at (B)). This is considered to be because the adhesion strength of the self-assembled monolayer 9 to the region A (transparent electrode layer 6) is different from that to the region B (first electroconductive layer 71). In other words, the self-assembled monolayer 9B on the region B which has a relatively low adhesion strength is selectively removed by contact with the plating solution. The phrase "while the self-assembled monolayer 9A is retained" in the region A suggests that there may partially exist an area where the self-assembled monolayer 9A is not formed (is removed) as long as the transparent electrode layer can be protected from the plating solution.

When the self-assembled monolayer 9B on the region B is removed in the plating solution in the plating step, the time for removing the monolayer may be appropriately set according to the type of the self-assembling compound, the materials of the transparent electrode layer 6 and the first electroconductive layer 71, the composition of the plating solution, and the like.

The metal deposited as the second electroconductive layer 72 is not particularly limited as long as it is a material that can be formed by a plating method, and for example, copper, nickel, tin, aluminum, chromium, silver, gold, zinc, lead, palladium or the like, or a mixture thereof can be used.

Electric current principally passes through the second electroconductive layer during operation (electricity generation) of the solar cell. Thus, the line resistance of the second electroconductive layer is preferably as low as possible so as to suppress the resistance loss in the second electroconductive layer. Specifically, the line resistance of the second electroconductive layer is preferably 1 Ω/cm or less, and more preferably 0.5 Ω/cm or less. On the other hand, it suffices that the line resistance of the first electroconductive layer is so low that the layer can function as an underlying layer at the time of electroplating, with an example thereof being 5 Ω/cm or less.

The second electroconductive layer can be formed by one of an electroless plating method and an electrolytic plating method, but the electrolytic plating method is suitably used in order to increase productivity. In the electrolytic plating method, the rate of deposition of a metal can be increased, so that the second electroconductive layer can be formed in a short time.

Figure 5:
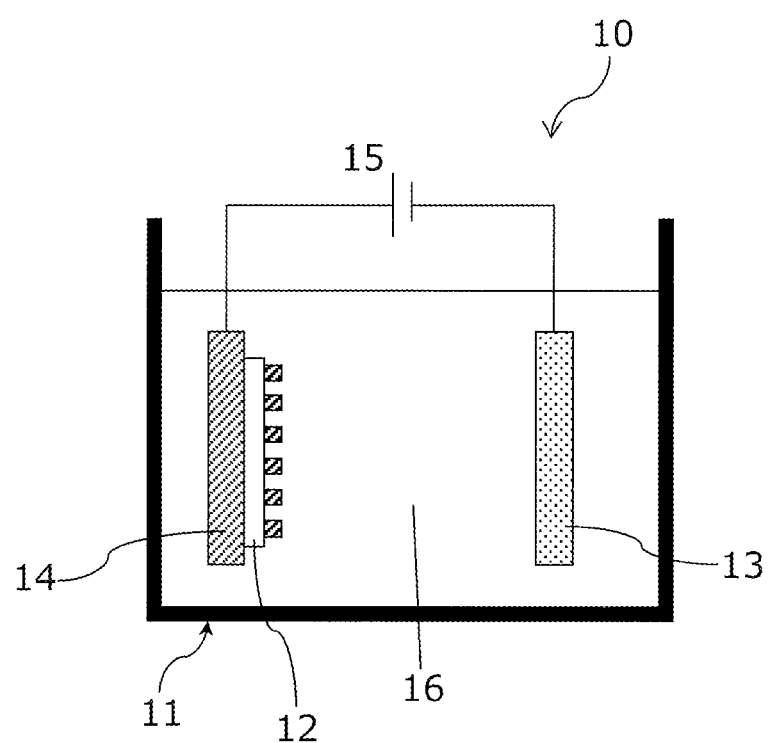
FIG. 5 is a structural schematic view of a plating apparatus.

Removal of the self-assembled monolayer 9B on the region B in the plating step and formation of the second electroconductive layer 72 by an electroplating method will be described with acidic copper plating as an example. FIG. 5 is a conceptual view of a plating apparatus 10 that is used for formation of the second electroconductive layer. A substrate 12 with a first electroconductive layer and a self-assembled monolayer formed on a photoelectric conversion section, and an anode 13 are immersed in a plating solution 16 in a plating tank 11. The first electroconductive layer 71 on the substrate 12 is connected to a power source 15 through a substrate holder 14. By applying a voltage between the anode 13 and the substrate 12, copper can be selectively deposited on the first electroconductive layer.

When the self-assembled monolayer is formed on the region B (first electroconductive layer) in the monolayer forming step, the self-assembled monolayer 9B on the region B can also be selectively removed in the plating step as described above. Since a voltage is continuously applied, copper can be selectively deposited on the first electroconductive layer in the region B where the self-assembled monolayer 9B is removed, so that the second electroconductive layer can be formed with good productivity.

The plating solution 16 used for acidic copper plating contains copper ions. For example, a solution of known composition, which is composed mainly of copper sulfate, sulfuric acid and water, can be used, and by causing a current of 0.1 to 10 A/dm$^2$ to pass therethrough, a metal as the second electroconductive layer can be deposited. The suitable plating time is appropriately set according to the area of a collecting electrode, the current density, cathode current efficiency, desired thickness and so on.

The second electroconductive layer may be composed of a plurality of layers. For example, by forming a first plating layer, made of a material having a high electroconductivity, such as Cu, on the first electroconductive layer, and then forming on the surface of the first plating layer a second plating layer excellent in chemical stability, a collecting electrode having low resistance and being excellent in chemical stability can be formed. In order to reduce losses caused by resistance, the second electroconductive layer preferably includes copper, which is high in electroconductivity.

It is preferable that after carrying out the plating step, a plating solution removing step is performed to remove a plating solution remaining on the surface of the substrate 12. Removal of the plating solution can be performed by, for example, a method in which plating solution remaining on the surface of the substrate 12 taken out from a plating tank is removed by air blow-type air washing, rinsing is then carried out, and a washing fluid is blown off by air blow. By reducing the amount of plating solution remaining on the surface of the substrate 12 by carrying out air washing before rinsing, the amount of the plating solution brought in at the time of rinsing can be decreased. Therefore, the amount of washing fluid required for rinsing can be decreased, and time and effort for waste liquid treatment associated with rinsing can also be reduced, so that environmental burdens and expenses resulting from washing are reduced, and productivity of the solar cell can be improved.

In addition, the self-assembled monolayer formed on the transparent electrode layer in the region A may be removed after the plating step. As described above, when the self-assembled monolayer has sufficient transparency, it is not necessary to remove the self-assembled monolayer and the solar cell can be provided for a practical use without removing the monolayer.

Explanations have been provided principally for the case of providing the collecting electrode 70 on the light incident side of the heterojunction solar cell, but a similar collecting electrode may also be formed on the back side. A solar cell using a crystalline silicon substrate, like the heterojunction solar cell, has a high current value, so that generally the electricity generation loss due to a contact resistance between the transparent electrode layer and the collecting electrode tends to be remarkable. In contrast, in the present invention, the collecting electrode having the first electroconductive layer and the second electroconductive layer has low contact resistance with the transparent electrode layer, thus making it possible to reduce the electricity generation loss resulting from contact resistance.

The manufacturing method of the solar cell of the present invention is applicable to various kinds of solar cells having a transparent electrode layer on the surface, such as: silicon-based thin-film solar cells having a transparent electrode layer on a pin junction or a pn junction of an amorphous silicon-based thin-film or a crystalline silicon-based thin-film, compound semiconductor solar cells such as CIS and CIGS; and organic thin-film solar cells, such as dye-sensitized solar cells and organic thin-film (electroconductive polymer).

The solar cell of the present invention is preferably modularized when put into practical use. Modularization of the solar cell is performed by an appropriate method. For example, by connecting a bus bar via an interconnector such as a TAB to a collecting electrode, a plurality of solar cells are connected in series or in parallel, and sealed by a sealing material and a glass plate to thereby perform modularization.

EXAMPLES

The present invention will be more specifically described below by showing examples relating to the heterojunction solar cell shown in FIG. 2, but the present invention is not limited to the Examples below.

Example 1

A heterojunction solar cell of Example 1 was manufactured in the following manner.

An n-type single-crystal silicon wafer having a light incident surface direction identical to the (100) surface and having a thickness of 200 μm was provided as a single-crystal silicon substrate of a first conductivity type. The silicon wafer was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water. The surface of the wafer was observed using an atomic force microscope (AFM manufactured by Pacific Nanotechnology, Inc.), and it was confirmed that the surface of the wafer was etched, and a pyramidal texture surface exposed at the (111) plane was formed.

The wafer after etching was introduced into a CVD apparatus, and at the light incident side thereof, i-type amorphous silicon was formed with a thickness of 5 nm as an intrinsic silicon-based thin-film 2a. Conditions for forming i-type amorphous silicon included a substrate temperature of 150° C., a pressure of 120 Pa, a $SiH_4/H_2$ flow ratio of 3/10 and a power density supply of 0.011 W/cm$^2$. The thickness of the thin-film in this example is a value calculated from a formation rate determined by measuring the thickness of a thin-film formed on a glass substrate under the same conditions using a spectroscopic ellipsometry (trade name: M2000, manufactured by J.A. Woollam Co. Inc.).

On the i-type amorphous silicon layer 2a, p-type amorphous silicon was formed with a thickness of 7 nm as a silicon-based thin-film 3a of an opposite conductivity type. Conditions for forming the p-type amorphous silicon layer 3a included a substrate temperature of 150° C., a pressure of 60 Pa, a $SiH_4/B_2H_6$ flow ratio of 1/3 and a power density supply of 0.01 W/cm$^2$. The $B_2H_6$ gas flow rate mentioned above is a flow rate of a diluting gas wherein $B_2H_6$ concentration was diluted to 5000 ppm using $H_2$ gas.

Thereafter, on the back side of the wafer, an i-type amorphous silicon layer was formed with a thickness of 6 nm as an intrinsic silicon-based thin-film 2b. Conditions for forming the i-type amorphous silicon layer 2b were the same as those for the aforementioned i-type amorphous silicon layer 2a. On the i-type amorphous silicon layer 2b, an n-type amorphous silicon layer was formed with a thickness of 4 nm as a silicon-based thin-film 3b of the first conductivity type. Conditions for forming the n-type amorphous silicon layer 3b included a substrate temperature of 150° C., a pressure of 60 Pa, a $SiH_4/PH_3$ flow ratio of 1/2 and a power density supply of 0.01 W/cm$^2$. The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers 6a and 6b, respectively. The transparent electrode layer was formed by applying a power density of 0.5 W/cm$^2$ in an argon atmosphere at a substrate temperature of room temperature and a pressure of 0.2 Pa using indium oxide as a target. On the back side transparent electrode layer 6b, silver was formed with a thickness of 500 nm as a back side metal electrode 8 by a sputtering method. A collecting electrode 70 having a first electroconductive layer 71 and a second electroconductive layer 72 was formed on the light incident side transparent electrode layer 6a in the following manner.

For the formation of the first electroconductive layer 71, a printing paste including a silver powder and an epoxy-based resin as a binder resin was used. The printing paste was screen-printed using a screen plate of #230 mesh (opening width: l=85 μm) having an opening width (L=80 μm) matching a collecting electrode pattern. Thereafter, for solidifying the silver paste, heating was performed in the air at 150° C. for 60 minutes to form the comb-shaped first electroconductive 71.

A substrate 12 provided with the first electroconductive layer 71 was immersed in an isopropanol solution (preparation solution) containing 5 mM octadecyl sulfonic acid (ODPA) as a self-assembling compound for 2 minutes to form a preparation solution layer on the transparent electrode layer 6a and the first electroconductive layer 71.

The wafer after being immersed was introduced into a circulating hot air oven, and subjected to a heating/annealing treatment in an air atmosphere at 120° C. for 10 minutes to form a self-assembled monolayer 9.

The substrate 12 subjected to steps up to and including the monolayer forming step as described above was introduced into a plating tank 11 as shown in FIG. 5. For a plating solution 16, one obtained by adding additives (product numbers: ESY-2B, ESY-H and ESY-1A manufactured by Uyemura & CO., LTD.) to an aqueous solution prepared so that the concentrations of copper sulfate pentahydrate, sulfuric acid and sodium chloride were 120 g/l, 150 g/l and 70 mg/l, respectively, was used. Using the plating solution, plating was carried out under conditions including a temperature of 40° C. and a current of 3 A/dm$^2$, so that on the first electroconductive layer 71, copper was uniformly deposited in a thickness of about 10 μm as a second electroconductive layer 72. Little copper was deposited onto a region A which was not provided with the first electrically conductive layer.

Thereafter, the silicon wafer on the cell outer periphery was removed in a width of 0.5 mm by a laser processing apparatus to prepare the heterojunction solar cell of the present invention.

Example 2

A heterojunction solar cell was prepared in the same manner as in Example 1 except that tetradecyl phosphonic acid (TDPA) was used as the self-assembling compound.

Example 3

A heterojunction solar cell was prepared in the same manner as in Example 1 except that the time during which the substrate 12 was immersed in the isopropanol solution of octadecyl phosphonic acid (ODPA) after the formation of the first electroconductive layer was 1 minute.

Example 4

A heterojunction solar cell was prepared in the same manner as in Example 1 except that the time during which the substrate 12 was immersed in the isopropanol solution of octadecyl phosphonic acid (ODPA) after the formation of the first electroconductive layer was 60 minutes.

Example 5

A heterojunction solar cell was prepared in the same manner as in Example 1 except that, after the annealing treatment after the formation of the self-assembled monolayer 9, a series of treatments, including the immersion of the substrate 12 in a solution of the self-assembling compound and a subsequent annealing treatment, was further repeatedly performed two times under the same conditions as the first series of treatments, so that the series of treatments was performed three times in total.

Example 6

A heterojunction solar cell was prepared in the same manner as in Example 1 except that the temperature of the annealing treatment after the formation of the self-assembled monolayer 9 was 60° C.

Example 7

A heterojunction solar cell was prepared in the same manner as in Example 1 except that the temperature of the annealing treatment after the formation of the self-assembled monolayer 9 was 180° C.

Comparative Example 1

Formation of a second electroconductive layer by a plating method was performed without carrying out the monolayer forming step after the formation of the first electroconductive layer in Example 1. As a result, the second electroconductive layer was formed, but a problem occurred where copper was deposited over almost the entire surface of the transparent electrode layer due to plating, so that the incident surface side of the cell was covered with copper, and a product functioning as a solar cell could not be obtained.

Comparative Example 2

An attempt was made to form the first electroconductive layer after the monolayer forming step was carried out, i.e., the order of the first electroconductive layer forming step and the monolayer forming step was reversed, after the formation of the transparent electrode layer in Example 1. As a result, such a problem occurred that the first electroconductive layer was peeled without being adhered to the wafer surface, so that a collecting electrode could not be formed, and a product functioning as a solar cell could not be obtained.

Conditions for the monolayer forming step, contact angles with water before and after plating, presence/absence of the plating step, and ratings after preparation of the solar cell for Examples 1 to 7 and Comparative Examples 1 and 2 are shown in Table 1.

The rating after preparation of the solar cell in Table 1 was determined by visually observing a copper deposition state to examine whether or not the transparent electrode layer was protected from the plating solution according to a five-grade evaluation. The score "5" was assigned when little copper was deposited on the transparent electrode layer in the region A, the score "3" was assigned when copper was partially deposited but solar cell characteristics were not significantly affected, i.e., almost the entire surface of the transparent electrode layer was protected by the self-assembled monolayer, and the score "1" was assigned when copper was deposited over almost the entire surface.

TABLE 1

| | | | SAM forming step | | | | | |
|---|---|---|---|---|---|---|---|---|
| | SAM material | Solvent | SAM concentration (mM) | Immersion time (minutes) | Annealing temperature (° C.) | Annealing time (minutes) | Number of times of execution of SAM forming step | Plating step |
| Example 1 | ODPA | IPA | 5 | 2 | 120 | 10 | 1 | Present |
| Example 2 | TDPA | IPA | 5 | 2 | 120 | 10 | 1 | Present |
| Example 3 | ODPA | IPA | 5 | 1 | 120 | 10 | 1 | Present |

TABLE 1-continued

| | | | | | | | | |
|---|---|---|---|---|---|---|---|---|
| Example 4 | ODPA | IPA | 5 | 60 | 120 | 10 | 1 | Present |
| Example 5 | ODPA | IPA | 5 | 2 | 120 | 10 | 3 | Present |
| Example 6 | ODPA | IPA | 5 | 2 | 60 | 10 | 1 | Present |
| Example 7 | ODPA | IPA | 5 | 2 | 180 | 10 | 1 | Present |
| Comparative Example 1 | — | — | — | — | — | — | — | Present |
| Comparative Example 2 | ODPA | IPA | 5 | 2 | 120 | 10 | 1 | Absent |

| | Contact angle (°) | | | | Rating after preparation (protection of transparent electrode layer) |
|---|---|---|---|---|---|
| | Before immersion in plating solution | | After plating step | | |
| | | | $\theta_A$ (°) | | |
| | $\theta_A'$ (°) on transparent electrode layer | $\theta_B'$ (°) on first electroconductive layer | on transparent electrode layer | $\theta_B$ (°) on second electroconductive layer | |
| Example 1 | 131 | 140 | 119 | 29 | 5 |
| Example 2 | 129 | 89 | Not measured | | 5 |
| Example 3 | 130 | 113 | Not measured | | 5 |
| Example 4 | 134 | 115 | 115 | 27 | 4.5 |
| Example 5 | 128 | 107 | Not measured | | 5 |
| Example 6 | 130 | 110 | 99 | 23 | 3 |
| Example 7 | 128 | 104 | Not measured | | 4 |
| Comparative Example 1 | ≤10 | ≤10 | ≤10 | ≤10 | 1 |
| Comparative Example 2 | 130 | — | Not measured | | Not evaluated |

Figure 7:
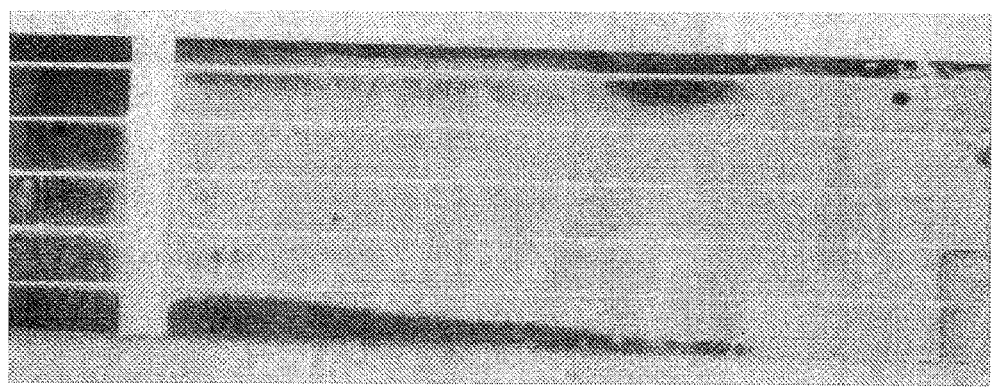
FIG. 7 is a photograph of a solar cell after a plating step in an Example.
Figure 8:
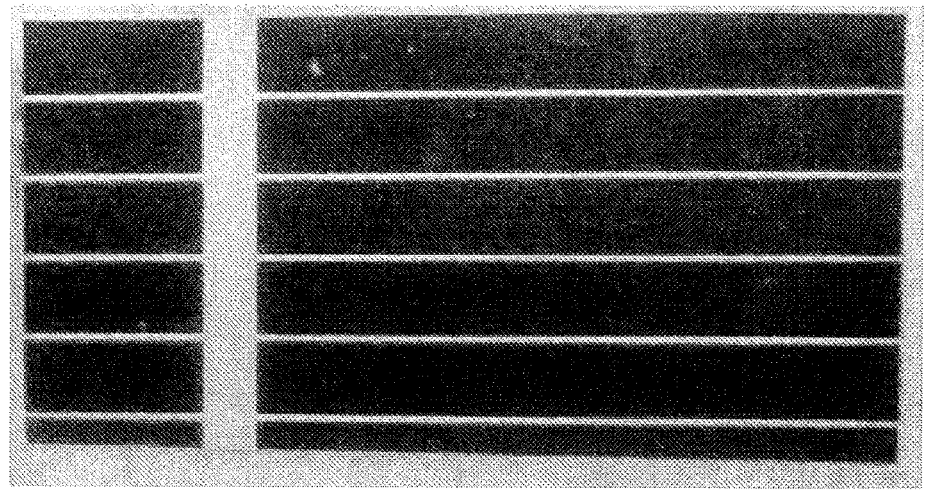
FIG. 8 is a photograph of a solar cell after a plating step in a Comparative Example.

Comparison of Examples with Comparative Example 1 shows that, in Comparative Example 1 where plating was performed without performing the monolayer forming step, copper was deposited also on the transparent electrode layer as shown in FIG. 7, so that the incident surface side of the cell was covered with copper, and a product functioning as a solar cell could not be obtained. On the other hand, in Examples where the plating step was carried out after the monolayer forming step, little copper was deposited on the transparent electrode layer, and the transparent electrode layer was not observed to be etched. This is considered to be because the self-assembled monolayer was formed on the transparent electrode layer, and owing to its water repellency and insulation property, the transparent electrode layer was protected from the plating solution. Particularly, in Example 1 and others, the score "5" was assigned for protection of the transparent electrode layer, and as shown in FIG. 8, deposition of copper was not observed.

Comparison of Examples with Comparative Example 2 shows that the first electroconductive layer and the second electroconductive layer could be successfully formed in Examples, while the first electroconductive layer was peeled from the transparent electrode layer in Comparative Example 2. This is considered to be because the first electroconductive layer was formed after the formation of the self-assembled monolayer, and therefore the adhesion strength between the first electroconductive layer and the transparent electrode layer was low.

In Examples, the first electroconductive layer was covered with the second electroconductive layer formed by plating, and there was no discontinued part in the second electroconductive layer. It is considered that in Examples, the contact angle $\theta_B'$ with water on the first electroconductive layer before immersion in the plating solution was 89 to 115°, and thus water repellency was exhibited, but only the self-assembled monolayer on the first electroconductive layer was removed by immersion in the plating solution, so that plated copper was selectively deposited on the first electroconductive layer.

It is considered that in Examples, the self-assembled monolayer in the region A covered the transparent electrode layer even after the plating step, and therefore little plated copper was deposited on the region A, because the value of $(\theta_A'-\theta_A)$ was 40° or less. Comparison of Examples 1, 4 and 6 with one another shows that, as the value of $(\theta_A'-\theta_A)$ decreased from 41° (Example 6) to 19° (Example 4) to 12° (Example 1), the rating for protection of the transparent electrode layer was improved from the score "3" (Example 6) to the score "4" (Example 4) to the score "5" (Example 1). It is considered that, when the adhesion strength of the self-assembled monolayer to the transparent electrode layer in the region A is high, the value of $(\theta_A'-\theta_A)$ decreases, so that the effect of protecting the transparent electrode layer is improved.

Comparison of Example 1 with Example 2 shows that there was no difference in rating after preparation of the solar cell between Example 1 using octadecyl phosphonic acid (ODPA) as the self-assembling compound and Example 2 using tetradecyl phosphonic acid (TDPA) as the self-assembling compound. It is considered that even when the self-assembling compound is changed, preparation of the collecting electrode of the solar cell is not affected as long as the requirements of adhesion strength with the transparent electrode layer, ease of removal from the first electroconductive layer during immersion in the plating solution, and the like are satisfied.

Comparison of Example 1 with Example 3 shows that there was no difference in rating after preparation of the solar cell, even when the time of immersion in the isopropanol solution containing 5 mM octadecyl phosphonic acid (ODPA) was reduced from 2 minutes to 1 minute. In Example 4, the immersion time was 60 minutes, but there was almost no difference in rating after preparation of the solar cell. Therefore, it is considered that, even when the immersion time was as short as about 1 to 2 minutes, the self-assembled monolayer could be formed to such an extent that the transparent electrode layer could be sufficiently protected.

Comparison of Example 1 with Example 5 shows that there was almost no difference in rating after preparation of the solar cell between Example 1, where the self-assembled monolayer forming step was carried out once, and Example 5, where the self-assembled monolayer forming step was carried out three times. This is considered to be because the transparent electrode layer was sufficiently protected by carrying out the self-assembled monolayer forming step one time.

Comparison of Examples 1, 6 and 7 with one another shows that the rating was improved from the score "3" to the score "5" as the annealing temperature was increased from 60° C. (Example 6) to 120° C. (Example 1). This is considered to be because as the annealing temperature was increased, adhesion between the transparent electrode layer and the self-assembled monolayer was enhanced, so that the effect of protecting the transparent electrode layer from the plating solution was improved.

Comparison of Example 1 with Example 7 shows that the annealing temperature was increased from 120° C. to 180° C. in heat annealing in the monolayer forming step, but there was no significant difference in rating after preparation of the solar cell. From this result, it is considered that the transparent electrode layer was sufficiently protected by the self-assembled monolayer, irrespective of whether the annealing temperature was 120° C. or 180° C. However, since the rating is higher at 120° C. (Example 1) than at 180° C. (Example 7), it is considered that the annealing temperature is more preferably about 100 to 160° C.

Hereinafter, heterojunction solar cells of Comparative Example 3 and Reference Example 1 were prepared by a conventional method, and their characteristics were compared with those of the solar cell of Example 1.

Comparative Example 3

A heterojunction solar cell was prepared in the same manner as in Example 1, except that the cell outer periphery was removed by a laser processing machine without carrying out the monolayer forming step, the annealing step, and the plating step after the formation of the first electroconductive layer by screen printing.

Reference Example 1

A heterojunction solar cell was prepared in the same manner as in Example 1, except that the second electroconductive layer was formed by a plating method after a resist was patterned by a photolithography method without forming the self-assembled monolayer after the formation of the first electroconductive layer. In patterning of the resist, first a photoresist was applied to the entire surface of a substrate, provided with layers up to and including the first electroconductive layer, using a spin coating method, the photoresist was dried, and the photoresist was then irradiated with an ultraviolet ray via a photomask having an opening pattern corresponding to the shape of the first electroconductive layer. Further, the substrate was immersed in a developer to form an opening pattern of the photoresist on the first electroconductive layer. Thereafter, the substrate was introduced into a plating apparatus, and an electric power was applied to the first electroconductive layer to form the second electroconductive layer on the opening pattern section of the photoresist. Thereafter, the photoresist was removed with a resist peeling solution, and an insulation treatment was performed by laser processing in the same manner as in Example 1.

Preparation conditions and results of measurements of solar cell characteristics (open circuit voltage (Voc), short circuit current density (Jsc), fill factor (FF) and conversion efficiency (Eff)) for the heterojunction solar cells of Example 1, Comparative Example 3, and Reference Example 1 are shown in Table 2.

TABLE 2

| | collecting electrode formation | | | conversion property | | | |
|---|---|---|---|---|---|---|---|
| | SAM | insulating layer | plating | Jsc (mA/cm$^2$) | Voc (V) | F.F. (%) | Eff. (%) |
| Example 1 | ODPA | — | performed | 36.7 | 0.718 | 74.9 | 19.7 |
| Comparative Example 3 | — | — | not performed | 35.9 | 0.718 | 74.5 | 19.2 |
| Reference Example 1 | — | resist pattern | performed | 35.9 | 0.718 | 76.7 | 19.7 |

Comparison of Example 1 with Comparative Example 3 shows that, in Example 1 where the second electroconductive layer formed by plating was provided on the screen-printed first electroconductive layer, higher FF was exhibited as compared to Comparative Example 3, where only an electrode formed by screen printing was provided. This is considered to be because the resistance of the electrode was reduced by forming plated copper having a low resistivity.

Comparison of Example 1 with Reference Example 1 shows that there was almost no difference in the values of the conversion characteristics of the solar cell. On the other hand, in Example 1, a step of patterning a resist is not required, and therefore operations are easily made by a small number of steps as compared to Reference Example 1, so that it may be possible to provide a solar cell at lower costs.

As described above using Examples, according to the present invention, a collecting electrode of a solar cell can be prepared by a plating method without carrying out a step of patterning an insulating layer, thus making it possible to provide a solar cell at low costs.

DESCRIPTION OF REFERENCE CHARACTERS 1 single-crystal silicon substrate of first conductivity type
2 intrinsic silicon-based thin-film
3 conductive silicon-based thin-film
6 transparent electrode layer
70 collecting electrode
71 first electroconductive layer
72 second electroconductive layer 8 back side metal electrode
9 self-assembled monolayer
90 region A
91 region B
9A self-assembled monolayer on region A
9B self-assembled monolayer on region B
50 photoelectric conversion section
100 solar cell
101 heterojunction solar cell
10 plating apparatus
11 plating tank
12 substrate
13 anode
14 substrate holder
15 power source
16 plating solution

The invention claimed is:

1. A method for manufacturing a solar cell, the solar cell comprising a photoelectric conversion section having a transparent electrode layer on an outermost surface on one main surface side, and a collecting electrode formed on the transparent electrode layer, the collecting electrode comprising a first electroconductive layer and a second electroconductive layer in this order from the photoelectric conversion section side, wherein the method comprises:
 a first electroconductive layer forming step of forming the first electroconductive layer on the transparent electrode layer;
 a monolayer forming step of forming a self-assembled monolayer on a region on the transparent electrode layer, which is not provided with the first electroconductive layer; and
 a second electroconductive layer forming step of bringing the first electroconductive layer and a plating solution into contact with each other to form the second electroconductive layer by a plating method, in this order.

2. The method for manufacturing the solar cell according to claim 1, wherein in the monolayer forming step, the self-assembled monolayer is also formed on at least a part of a region on the transparent electrode layer, which is provided with the first electroconductive layer.

3. The method for manufacturing the solar cell according to claim 2, further comprising a monolayer removing step after the monolayer forming step and before the second electroconductive layer forming step, wherein in the monolayer removing step, the self-assembled monolayer on the region provided with the first electroconductive layer is removed.

4. The method for manufacturing the solar cell according to claim 3, wherein the monolayer removing step is performed in the plating solution.

5. The method for manufacturing the solar cell according to claim 1, wherein
 in the monolayer forming step, a layer made of a preparation solution for forming the self-assembled monolayer is formed on the transparent electrode layer, and wherein the preparation solution is a solution containing a self-assembling compound.

6. The method for manufacturing the solar cell according to claim 5, wherein in the monolayer forming step, a heating is performed after the formation of the layer made of the preparation solution.

7. The method for manufacturing the solar cell according to claim 5, wherein the self-assembling compound in the preparation solution is an alkyl phosphonic acid compound or an alkyl silane compound.

8. The method for manufacturing the solar cell according to claim 1, wherein a contact angle $\theta_A$ of a surface of the transparent electrode layer with water on a region which is not provided with the first electroconductive layer is 50° or more and 160° or less.

9. The method for manufacturing the solar cell according to claim 1, wherein a difference $(\theta_A'-\theta_A)$ between contact angles $\theta_A'$ and $\theta_A$ is 0° to 60°, wherein $\theta_A'$ is a contact angle of a surface of the transparent electrode layer with water in a region which is not provided with the first electroconductive layer before the second electroconductive layer forming step, and $\theta_A$ is a contact angle of the surface of the transparent electrode layer with water in the region which is not provided with the first electroconductive layer after the second electroconductive layer forming step.

10. The method for manufacturing the solar cell according to claim 1, wherein a layer composed mainly of copper is formed as the second electroconductive layer in the second electroconductive layer forming step.

11. The method for manufacturing the solar cell according to claim 1, wherein the photoelectric conversion section includes a crystalline silicon substrate and a silicon-based thin film and the transparent electrode layer in this order on the crystalline silicon substrate.

12. A solar cell comprising: a photoelectric conversion section having a silicon-based thin film and a transparent electrode layer in this order on a crystalline silicon substrate; and a collecting electrode provided on the transparent electrode layer, wherein
 the transparent electrode layer is provided on an outermost surface of the photoelectric conversion section,
 the collecting electrode comprises a first electroconductive layer and a second electroconductive layer in this order from a photoelectric conversion section-side,
 a self-assembled monolayer is formed on an entire surface of a region of a surface of the transparent electrode layer, which is not provided with the first electroconductive layer, and
 the self-assembled monolayer comprises an alkyl phosphonic acid compound or an alkyl silane compound.

13. The solar cell according to claim 12, wherein a contact angle $\theta_A$ of the surface of the region, which is not provided with the first electroconductive layer, with water is 50° or more and 160° or less.

14. A solar cell module, comprising:
 a solar cell, including:
  a photoelectric conversion section having a silicon-based thin film and a transparent electrode layer in this order on a crystalline silicon substrate; and a collecting electrode provided on the transparent electrode layer, wherein
  the transparent electrode layer is provided on an outermost surface of the photoelectric conversion section,
  the collecting electrode comprises a first electroconductive layer and a second electroconductive layer in this order from a photoelectric conversion section-side,
  a self-assembled monolayer is formed on an entire surface of a region of a surface of the transparent electrode layer, which is not provided with the first electroconductive layer, and
  the self-assembled monolayer comprises an alkyl phosphonic acid compound or an alkyl silane compound.

* * * * *